United States Patent
Wyczynski

(10) Patent No.: US 12,249,619 B2
(45) Date of Patent: Mar. 11, 2025

(54) INTEGRATED CIRCUIT WITH COIL BELOW AND OVERLAPPING A PAD

(71) Applicant: Nvidia Corporation, Santa Clara, CA (US)

(72) Inventor: Jedrzej Wyczynski, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 379 days.

(21) Appl. No.: 17/728,542

(22) Filed: Apr. 25, 2022

(65) Prior Publication Data

US 2023/0343814 A1    Oct. 26, 2023

(51) Int. Cl.
 *H01F 27/28* (2006.01)
 *H01L 23/00* (2006.01)
 *H01L 23/522* (2006.01)
 *H01L 27/02* (2006.01)
 *H01L 49/02* (2006.01)

(52) U.S. Cl.
 CPC ......... *H01L 28/10* (2013.01); *H01F 27/2804* (2013.01); *H01L 23/5227* (2013.01); *H01L 24/05* (2013.01); *H01L 24/13* (2013.01); *H01L 27/0255* (2013.01); *H01L 2224/0401* (2013.01); *H01L 2224/05025* (2013.01); *H01L 2224/13026* (2013.01); *H01L 2924/1206* (2013.01)

(58) Field of Classification Search
 CPC ..... H01L 28/10; H01L 23/5227; H01L 24/05; H01L 24/13; H01L 27/0255; H01L 2224/0401; H01L 2224/05025; H01L 2224/13026; H01L 2924/1206; H01F 27/2804; H01F 2017/0073; H01F 2017/0086; H01F 17/0006
 See application file for complete search history.

(56) References Cited

U.S. PATENT DOCUMENTS

| | | | |
|---|---|---|---|
| 6,248,080 B1 * | 6/2001 | Miesel ................. | A61B 5/0215 600/311 |
| 6,282,079 B1 * | 8/2001 | Nagakari ............... | H01G 4/232 361/309 |
| 2015/0255406 A1 * | 9/2015 | Miao ..................... | H01L 23/564 257/738 |

* cited by examiner

Primary Examiner — Aaron J Gray
Assistant Examiner — Shawn Shaw Muslim

(57) ABSTRACT

An integrated circuit including a chip substrate having an upper isolation layer with a pad thereon and a coil located below the pad, where, in a dimension perpendicular to a surface of the chip substrate, a perimeter of the coil overlaps with a perimeter of the pad.

11 Claims, 5 Drawing Sheets

US 12,249,619 B2

INTEGRATED CIRCUIT WITH COIL BELOW AND OVERLAPPING A PAD

TECHNICAL FIELD

This application is directed, in general, to integrated circuit layouts and in particular, a landing pad of the integrated circuit.

BACKGROUND

In integrated circuit (IC) layouts, it can be advantageous to place a coil in between a pad (e.g., a contact pad or landing pad or bump pad, PAD) functioning as chip interface to transfer from/to the chip, and an electrostatic discharge (ESD) protection diode, with small area and small parasitic to the signal.

SUMMARY

One aspect provides an integrated circuit including a chip substrate having an upper isolation layer with a pad thereon and a coil located below the pad, where, in a dimension perpendicular to a surface of the chip substrate, a perimeter of the coil overlaps with a perimeter of the pad.

Another aspect provides another integrated circuit package including the integrated circuit with the chip substrate, the pad and the coil and further including, one or more first conductive interconnects electrically connecting the coil to the pad, one or more conductive second interconnects electrically connecting the coil to an electrostatic discharge diode located on a base isolation layer of the chip substrate, and, one or more conductive third interconnects electrically connecting the coil to integrated circuit devices located on the base isolation layer.

Another aspect includes a computer having one or more of the integrated circuits.

BRIEF DESCRIPTION

Figure 1:
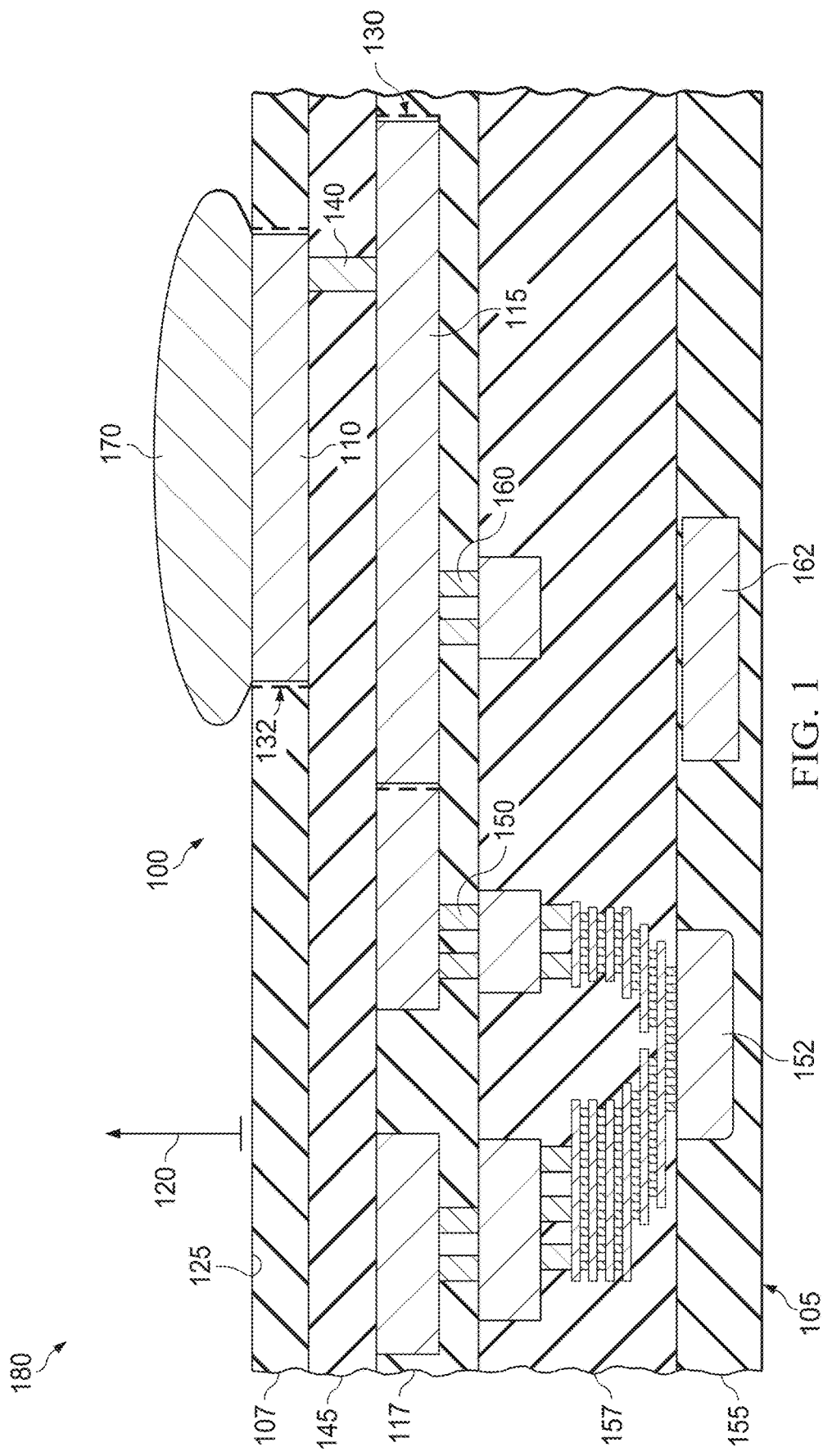
Figure 2A:
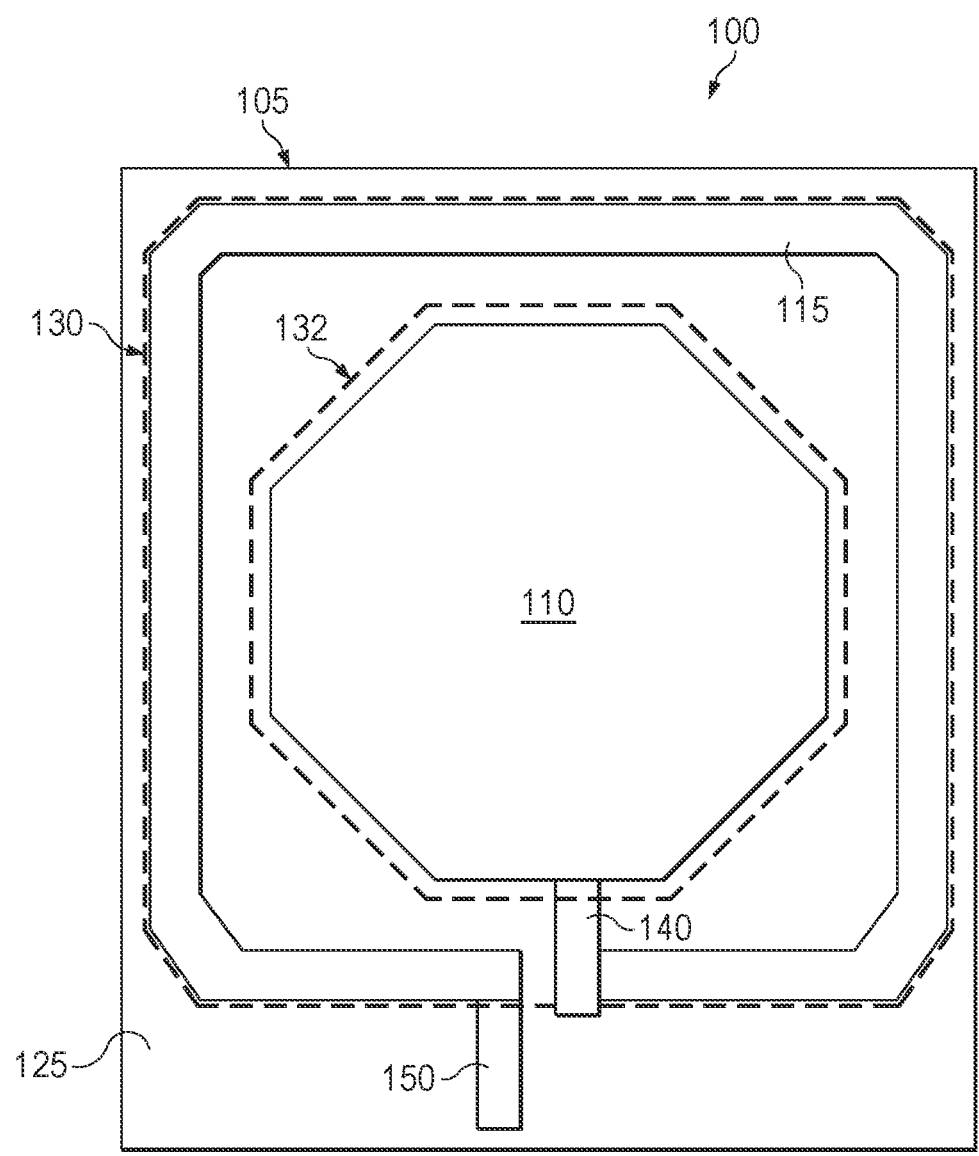
Figure 2B:
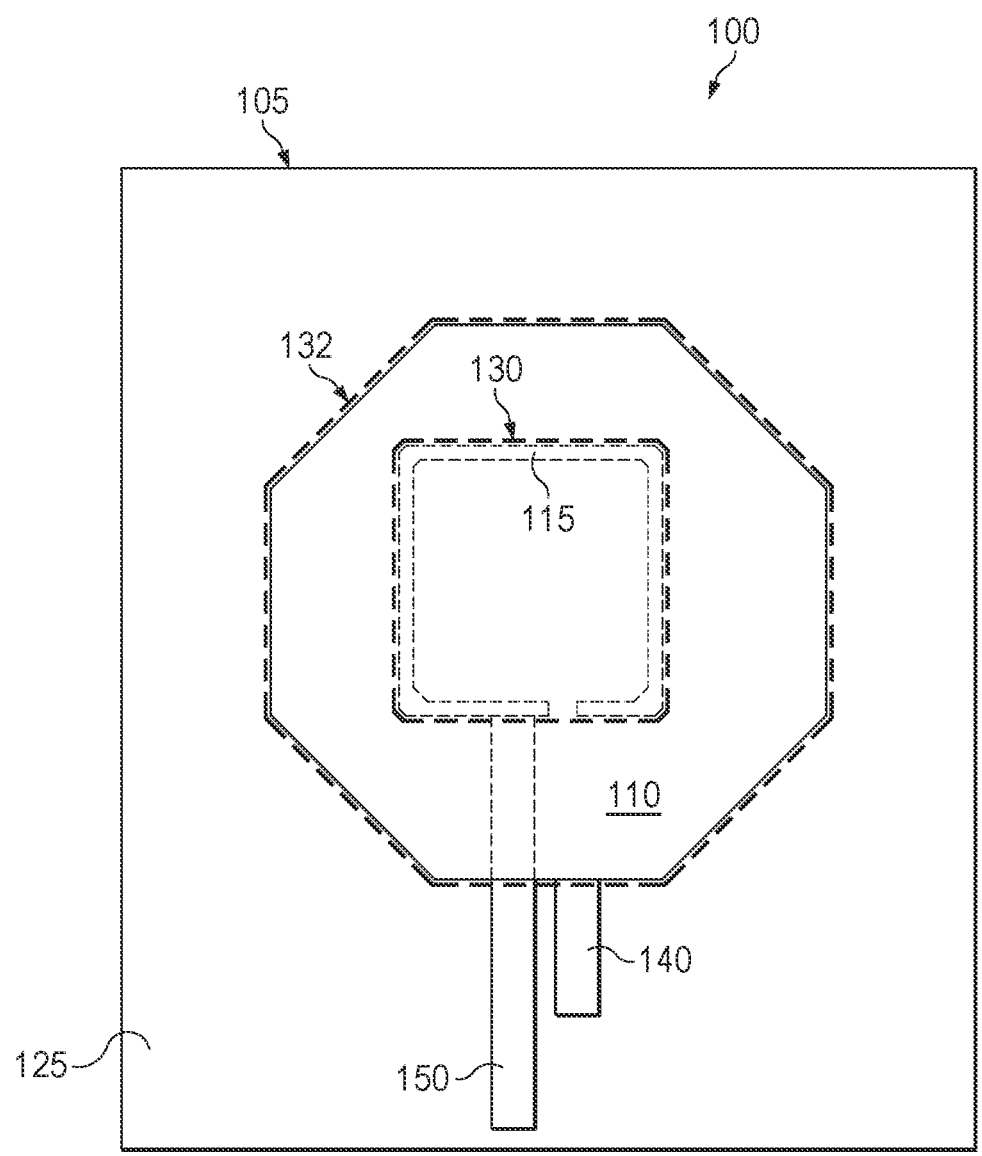
Figure 2C:
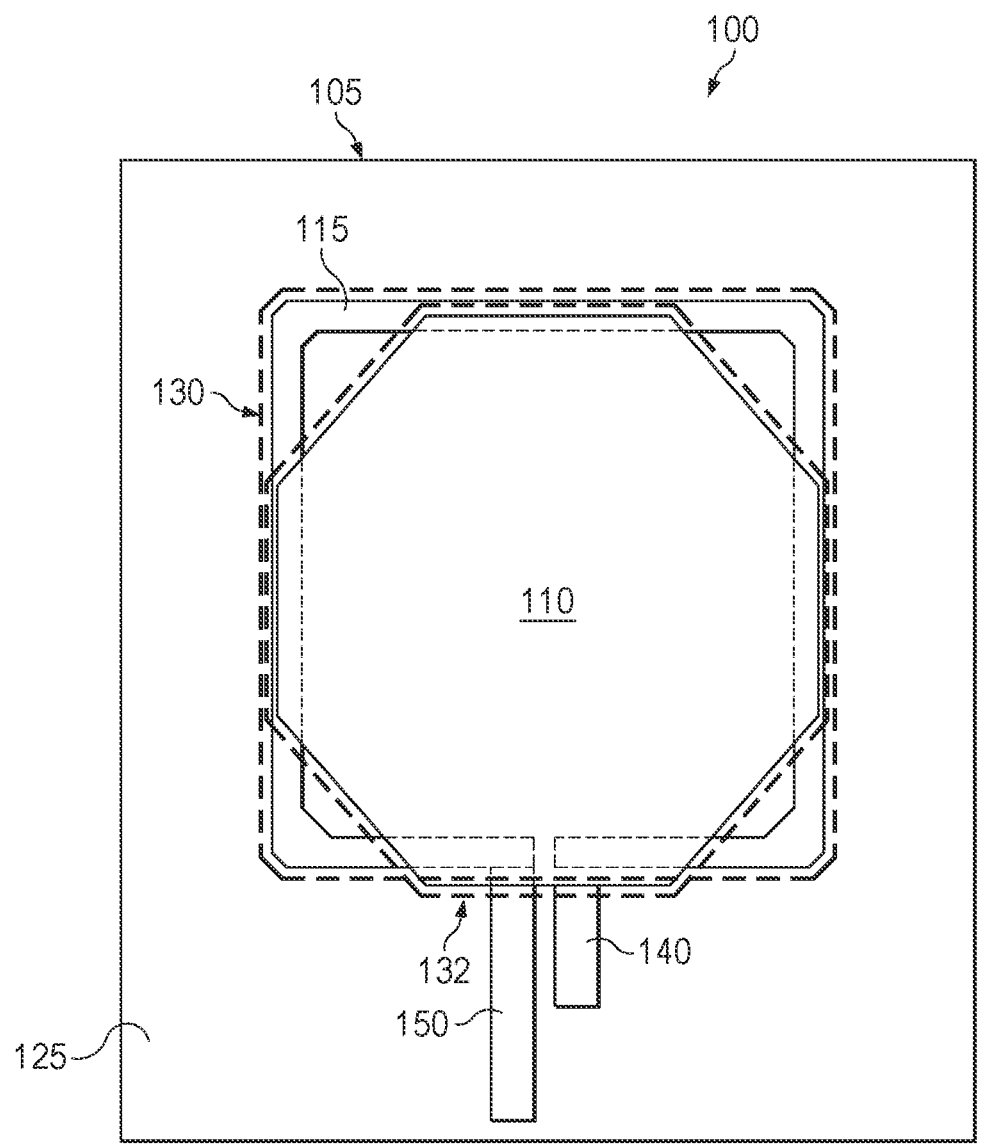
Figure 3:
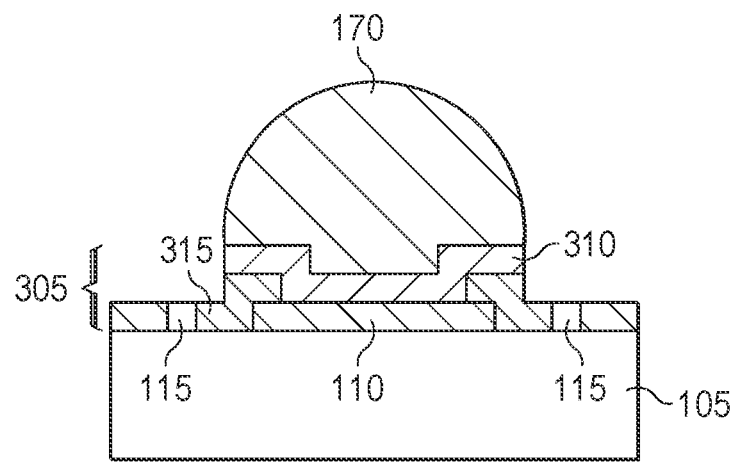
Figure 4:
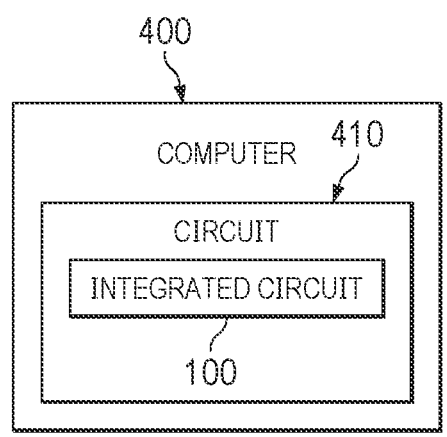

Reference is now made to the following descriptions taken in conjunction with the accompanying drawings, in which:

FIG. 1 presents a cross-sectional view of an example embodiment of an IC including a coil and PAD of the disclosure;

FIG. 2A-2C presents a top down views of example embodiments of the coil and PAD of the disclosure;

FIG. 3 presents a detailed cross-sectional view of an embodiment of the IC including the coil and the PAD of the disclosure and FIG. 4 presents a block diagram of a computer including one or more embodiments of the IC.

DETAILED DESCRIPTION

Embodiments of the disclosure follow from my idea that instead of placing a PAD, coil and ESD diode horizontally next to each other in an IC layout, the coil can be placed under the PAD to therefore save the layout area and reduce routing parasitics (e.g., parasitic resistance or parasitic capacitance).

This layout design has not been considered previously because typical fabrication layout rules do not allow a PAD in IC layers next to or overlapping the coil. Additional, it is traditionally thought that because having a PAD overlapping the coil will increase coil impedance, which is to be avoided, the layout design rules require the coil to stand alone or apart in the layout of PADS. However, for some IC layouts not as sensitive to impedance increases, the layout design disclosed herein can advantageously reduce routing parasitics with only a small increase in coil impedance. Moreover, as disclosed herein, while having a PAD overlapping with the coil increases coil impedance, making the coil perimeter bigger than the PAD perimeter can give spacing between the overlapping coil and PAD to mitigate the increased impedance.

Additionally, as part of this disclosure, I recognized that it is important to balance potential reductions in the coil's Quality factor ("Q") with increasing the coil's inductance. I discovered that with the PAD over of the coil, Q can be reduced substantially, while inductance can be increased but to a lesser extent. To mitigate Q degradation, the coil's size can be increased relative to the size of the PAD, but, this will cause inductance to increase. However, since the increase in inductance is relatively smaller as compared to the increase in Q this arrangement of coil and PAD is acceptable.

One embodiment of the disclosure is an integrated circuit that includes such a PAD and coil arrangement.

FIG. 1 presents a cross-sectional view of an example embodiment of an IC 100 including the PAD 110 and coil 115 of the disclosure and FIGS. 2A-2C present top down views of example embodiments of the coil and PAD of the disclosure.

With continuing reference to FIGS. 1 and 2A-2C throughout the IC 100 includes a chip substrate 105 having an upper isolation layer 107 with a PAD 110 thereon. The IC also includes a coil 115 located below the PAD.

In a dimension 120 perpendicular to a surface 125 of the chip substrate 105, a perimeter 130 of the coil overlaps with a perimeter 132 of the PAD.

In some embodiments, as illustrated in FIG. 1, the coil 115 can be located on a lower isolation layer 117 that is below the upper isolation layer 107. For instance, the coil can be a metal coil located between lower isolation layer 117 and one or more intermediate isolation layer 145 or between lower isolation layer 117 and upper isolation layer 107.

In some embodiments, in the dimension 120 perpendicular to the surface 125, the perimeter 132 of the PAD 110 is within the perimeter 130 of the coil 115 (e.g., FIG. 2A). In some such embodiments, such as shown in FIG. 3, the coil 115 can be a metal layer that is part of a same metal level 305 as the PAD 110 (e.g., an aluminum or other metal pad). As further illustrated, embodiments of the IC 100 can further include under bump metallization 310 and passivation 315 as familiar to those skilled in the pertinent art.

In some embodiments, in the dimension 120 perpendicular to the surface 125, the perimeter 130 of the coil 115 is within the perimeter 132 of the PAD 110 (e.g., FIG. 2B).

For instance, in some embodiments, in the dimension 120 perpendicular to the surface 125, the perimeter 130 of the coil 115 is partially outside the perimeter 132 of the PAD 110 (e.g., FIG. 2C).

In any such embodiments, the coil 115 can be electrically connected to the PAD 110 by one or more conductive interconnects (e.g., first interconnects 140). For instance, in some such embodiments, the conductive interconnects 140 can pass through one or more intermediate isolation layers 145 located between the upper isolation layer 107 and the lower isolation layer 117.

In any such embodiments, the coil 115 can be connected by one or more conductive interconnects (e.g., second interconnects 150) to an electrostatic discharge diode 152 located on a base isolation layer 155 of the chip substrate 105. In some such embodiments, the conductive interconnects 150 can pass through one or more redistribution isolation layers 157 located between the lower isolation layer 117 and the base isolation layer 155.

In any such embodiments, the coil 115 can be connected by one or more conductive interconnects (e.g., third interconnects 160) to integrated circuit devices 162 located on a base isolation layer 155 of the chip substrate 105. Non-limiting examples of integrated circuit devices 162 can include one more of a transistor, resistor, capacitor, varactor, diode of the IC 100.

In some embodiments, the coil 115 can be single turn coil while in other embodiments the coil can be a multi-turn coil (e.g., a two, three or four turn coil).

In any such embodiments, the perimeter 130 of the coil 115 coil can have a rectangular, circular, octagonal or other-regular or irregular shaped perimeter as familiar to those skilled in the pertinent art.

In any such embodiments, the perimeter 132 of the PAD 110 can have a rectangular, circular, octagonal or other regular or irregular shaped perimeters as familiar to those skilled in the pertinent art, e.g., as required by a particular fabrication process for solder bump connection.

Another embodiment of the disclosure is an integrated circuit package 180 that any embodiments of the IC disclosed herein. For instance the package can include an IC 100 with the chip substrate 105 having a upper isolation layer 107 with a PAD 110 thereon, a coil 115 located on an lower isolation layer 117, where in a dimension 120 perpendicular to a surface 125 of the chip substrate 105, a perimeter 130 of the coil overlaps with a perimeter 132 of the PAD.

Further, the package 180 can include one or more conductive first interconnects 140 electrically connecting the coil 115 to the PAD 110, one or more conductive second interconnects 150 electrically connecting the coil 115 to an electrostatic discharge diode 152 located on a base isolation layer 155 of the chip substrate 105 and one or more conductive third interconnects 160 electrically connecting the coil 115 to integrated circuit devices 162 located on the base isolation layer 155.

In any such embodiments, the package 180 can further including an input/output solder bump 170 ("I/O bump" FIG. 1) connected to the PAD 110.

In any such embodiments of the package 180, the integrated circuit devices 162 can include one or more of a transistor, resistor, capacitor, varactor or diode or similar components as familiar to those skilled in the pertinent art.

Another embodiment of the disclosure is a computer. FIG. 4 presents a block diagram of a computer 400 having one or more circuits 410 that include one or more embodiments of the IC 100 with any embodiments of the coil and the PAD arranged as disclosed herein, e.g., as disclosed in the context of FIGS. 1-3.

Those skilled in the art to which this application relates will appreciate that other and further additions, deletions, substitutions and modifications may be made to the described embodiments.

What is claimed is:

1. An integrated circuit, comprising:
a chip substrate having a upper isolation layer with a pad thereon; and
a coil located below the metal pad, wherein, in a dimension perpendicular to a surface of the chip substrate, a perimeter of the coil overlaps with a perimeter of the pad, wherein the coil is electrically connected to the pad by one or more conductive interconnects.

2. The integrated circuit of claim 1, wherein the conductive interconnects pass through one or more intermediate isolation layers located between the upper isolation layer and the lower isolation layer.

3. An integrated circuit, comprising:
a chip substrate having a upper isolation layer with a pad thereon; and
a coil located below the metal pad, wherein, in a dimension perpendicular to a surface of the chip substrate, a perimeter of the coil overlaps with a perimeter of the pad, wherein the coil is connected by one or more conductive interconnects to an electrostatic discharge diode located on a base isolation layer of the chip substrate.

4. The integrated circuit of claim 3, wherein the conductive interconnects pass through one or more redistribution isolation layers located between the lower isolation layer and the base isolation layer.

5. An integrated circuit, comprising:
a chip substrate having a upper isolation layer with a pad thereon; and
a coil located below the metal pad, wherein, in a dimension perpendicular to a surface of the chip substrate, a perimeter of the coil overlaps with a perimeter of the pad, wherein the coil is connected by one or more conductive interconnects to integrated circuit devices located on a base isolation layer of the chip substrate.

6. An integrated circuit package, comprising:
an integrated circuit, including:
a chip substrate having a upper isolation layer with a pad thereon;
a coil located below the pad, wherein, in a dimension perpendicular to a surface of the chip substrate, a perimeter of the coil overlaps with a perimeter of the pad;
one or more conductive first interconnects electrically connecting the coil to the pad;
one or more conductive second interconnects electrically connecting the coil to an electrostatic discharge diode located on a base isolation layer of the chip substrate; and
one or more conductive third interconnects electrically connecting the coil to integrated circuit devices located on the base isolation layer.

7. The package of claim 6, further including an input output solder bump connected to the pad.

8. The package of claim 6, wherein the integrated circuit devices includes one or more of a transistor, resistor, capacitor, varactor or diode.

9. A computer having one or more circuits that include the integrated circuit of claim 6.

10. An integrated circuit package, comprising:
an integrated circuit, including:
a chip substrate having a upper isolation layer with a pad thereon;
a coil located below the pad, wherein, in a dimension perpendicular to a surface of the chip substrate, an area defined by a perimeter of the coil overlaps with an area defined by a perimeter of the pad such that the area of the pad is within the area of the coil, the area of the coil is within the area of the pad, or, the area of the coil is partially outside the area of the pad;
one or more conductive first interconnects electrically connecting the coil to the pad;

one or more conductive second interconnects electrically connecting the coil to an electrostatic discharge diode located on a base isolation layer of the chip substrate; and one or more conductive third interconnects electrically connecting the coil to integrated circuit devices located on the base isolation layer.

11. A computer having one or more circuits that include the integrated circuit of claim 10.

* * * * *